(12) United States Patent
Zhang et al.

(10) Patent No.: US 11,387,378 B2
(45) Date of Patent: Jul. 12, 2022

(54) P-OHMIC CONTACT STRUCTURE AND PHOTODETECTOR USING THE SAME

(71) Applicant: BOLB INC., San Jose, CA (US)

(72) Inventors: Jianping Zhang, San Jose, CA (US); Ling Zhou, San Jose, CA (US); Ying Gao, San Jose, CA (US)

(73) Assignee: BOLB INC., Livermore, CA (US)

( * ) Notice: Subject to any disclaimer, the term of this patent is extended or adjusted under 35 U.S.C. 154(b) by 53 days.

(21) Appl. No.: 17/037,333

(22) Filed: Sep. 29, 2020

(65) Prior Publication Data

US 2022/0102572 A1     Mar. 31, 2022

(51) Int. Cl.
| | |
|---|---|
| *H01L 31/102* | (2006.01) |
| *H01L 31/109* | (2006.01) |
| *H01L 31/0296* | (2006.01) |

(52) U.S. Cl.
CPC ...... *H01L 31/109* (2013.01); *H01L 31/02966* (2013.01)

(58) Field of Classification Search
CPC ............. H01L 31/109; H01L 31/02966; H01L 31/035209; H01L 31/1016; H01L 31/02327; H01L 31/022408; H01L 31/035236; H01L 31/105
See application file for complete search history.

(56) References Cited

U.S. PATENT DOCUMENTS

2010/0244084 A1 * 9/2010 Song ...................... H01L 33/14
                                                                   257/99
2016/0336483 A1 * 11/2016 Shatalov .................. H01L 33/32

* cited by examiner

*Primary Examiner* — Calvin Y Choi
(74) *Attorney, Agent, or Firm* — J.C. Patents

(57) ABSTRACT

A photodetector includes an UV transparent n-type structure, an UV transparent p-type structure, and a photon absorbing region sandwiched between the n-type structure and the p-type structure; a p-contact layer formed on the p-type structure; and a p-ohmic contact of a thickness in the range of 0.2-100 nm formed on the p-contact layer, wherein the p-ohmic contact comprises one or more layer of metal oxide.

17 Claims, 10 Drawing Sheets

US 11,387,378 B2

P-OHMIC CONTACT STRUCTURE AND PHOTODETECTOR USING THE SAME

FIELD OF THE INVENTION

The present disclosure relates in general to semiconductor light emitting and/or detecting technology and, more particularly, to a p-ohmic contact structure and a light-emitting diode or a photodetector using the same.

DESCRIPTION OF THE RELATED ART

Nitride compound semiconductors such as InN, GaN, AlN, and their ternary and quaternary alloys depending on alloy composition enable ultraviolet (UV) emissions ranging from 410 nm approximately to 200 nm. These include UVA (400-315 nm), UVB (315-280 nm), and part of UVC (280-200 nm) emissions. UVA emissions are leading to revolutions in curing industry, and UVB and UVC emissions owing to their germicidal effect are looking forward to general adoption in food, water, and surface disinfection businesses. Compared to the traditional UV light sources, such as mercury lamps, UV light emitters made of nitride compounds offer intrinsic merits. In general, nitride UV emitters are robust, compact, spectrum adjustable, and environmentally friendly. They offer high UV light intensity and dosage, facilitating an ideal disinfection/sterilization treatment for water, air, food and object surface. Further, the light output of nitride UV light emitters can be modulated at high frequencies up to a few hundreds of mega-hertz, promising them to be innovative light sources for Internet of Things, covert communications and bio-chemical detections.

A UV light-emitting diode (LED) comprises an n-type AlGaN structure, a p-type AlGaN structure, and a light-emitting structure commonly made of AlGaN multiple-quantum-well (MQW) sandwiched in-between the n-type and p-type AlGaN structures. An AlGaN structure can be made of an AlGaN layer or many AlGaN layers joint forces to deliver a better function, such as to improve material quality, conductivity and/or carrier confinement. The deep level nature of acceptors in AlGaN materials makes p-type AlGaN structure highly resistive and not suitable for p-type ohmic contact formation, hence a thick (usually more than 100 nm-thick) p-type GaN layer is conventionally formed on top of the p-AlGaN structure to serve as a p-contact layer for UV LEDs. The p-contact metal scheme for conventional UV LEDs includes a nickel (Ni) layer deposited on the p-type GaN layer and a following gold (Au) cap layer. As GaN has a UV transmission cutoff edge at 365 nm, the thick p-GaN layer virtually absorbs all UVB and UVC photons. Leftover photons if any, will further be absorbed by Ni/Au p-contact. As such, the conventional UV LEDs are of poor efficiency, usually of less than 5% electrical-optical power conversion efficiency (PCE).

As disclosed in U.S. Pat. No. 10,276,746, a two-dimensional hole gas (2DHG) can be formed and confined in the surface of an engineered AlGaN layer utilizing the huge polarization fields of AlGaN materials. This engineered AlGaN layer can serve as a hole supplier and p-contact layer, enabling a UV transparent UV LED epitaxial structure. UV reflective p-contact metal schemes are desired to maximize the light extraction and power conversion efficiencies provided by this UV transparent UV LED epitaxial structure.

SUMMARY

One aspect of the present disclosure provides a photodetector including:
an n-type structure, an UV transparent p-type structure, and a photon absorbing region sandwiched between the n-type structure and the UV transparent p-type structure;
an UV transparent p-contact layer formed on the UV transparent p-type structure; and
a p-ohmic contact of a thickness in the range of 0.2-100 nm formed on the p-contact layer, wherein the p-ohmic contact comprises one or more layer of metal oxide.

Another aspect of the present disclosure provides another photodetector including:
an n-type structure, an UV transparent p-type structure, and a photon absorbing region sandwiched between the n-type structure and the UV transparent p-type structure;
an UV transparent p-contact layer formed on the UV transparent p-type structure; and
a p-ohmic contact on the UV transparent p-contact layer, wherein the p-ohmic contact is formed by sequentially depositing one or more layers of metal on the UV transparent p-contact layer and oxidizing the one or more layers of metal.

BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

DETAILED DESCRIPTION OF EMBODIMENTS

Throughout the specification, the term group III nitride in general refers to metal nitride with cations selecting from group IIIA of the periodic table of the elements. That is to say, III-nitride includes AlN, GaN, InN and their ternary (AlGaN, InGaN, InAlN) and quaternary (AlInGaN) alloys. In this specification, a quaternary can be reduced to a ternary for simplicity if one of the group III elements is significantly small so that its existence does not affect the intended function of a layer made of such material. For example, if the In-composition in a quaternary AlInGaN is significantly small, smaller than 1%, then this AlInGaN quaternary can be shown as ternary AlGaN for simplicity. Using the same logic, a ternary can be reduced to a binary for simplicity if one of the group III elements is significantly small. For example, if the In-composition in a ternary InGaN is significantly small, smaller than 1%, then this InGaN ternary can be shown as binary GaN for simplicity. Group III nitride may also include small amount of transition metal nitride such as TiN, ZrN, HfN with molar fraction not larger than 10%. For example, III-nitride or nitride may include $Al_xIn_yGa_zTi_{(1-x-y-z)}N$, $Al_xIn_yGa_zZr_{(1-x-y-z)}N$, $Al_xIn_yGa_zHf_{(1-x-y-z)}N$, with $(1-x-y-z) \leq 10\%$.

As well known, light-emitting devices such as light-emitting diodes (LEDs) and laser diodes, commonly adopt a laminate structure containing a quantum well active region, an n-type group III nitride structure for injecting electrons into the active region, and a p-type group III nitride structure on the other side of the active region for injecting holes into the active region.

Figure 1:
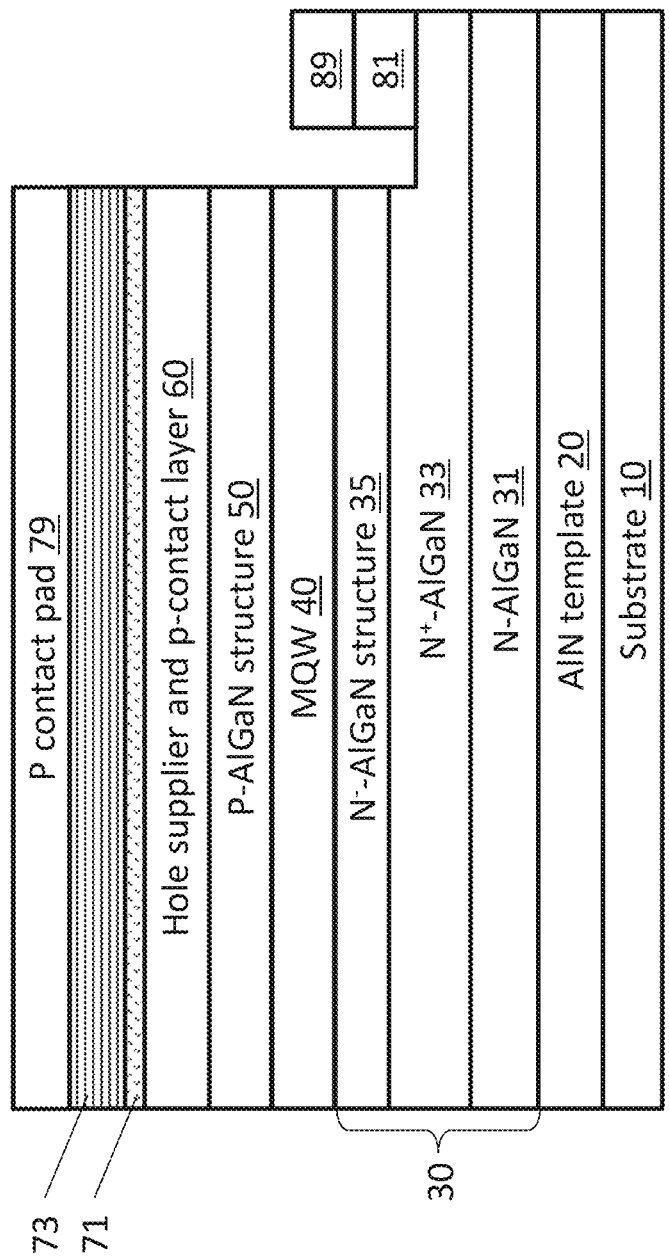
FIG. 1 illustrates a UV LED epitaxial layered structure according to an embodiment of the present invention.

Illustrated in FIG. 1 is a cross-sectional schematic view of a UV LED structure according to an embodiment of the present invention. The structure starts with a UV transparent substrate 10. Substrate 10 can be selected from sapphire, AlN, SiC, and the like. Formed over substrate 10 is a template 20, which can be made of a thick AlN layer, for example, with a thickness of 0.3-4.0 µm. Even though not shown in FIG. 1, a strain management structure such as an Al-composition grading AlGaN layer or sets of AlN/AlGaN superlattices can be formed over template 20. Formed over template 20 is a thick n-AlGaN structure 30 for electron supply and n-type ohmic contact formation. Structure 30 may include a thick (2.0-5.0 µm such as 3.0 µm, $n=2.0 \times 10^{18}$-$5.0 \times 10^{18}$ cm$^{-3}$) n-type N—AlGaN layer 31 for current spreading, a heavily n-type doped (0.2-0.8 µm such as 0.60 µm, $n=8 \times 10^{18}$-$2 \times 10^{19}$ cm$^{-3}$) NtAlGaN layer 33 for MQW active-region polarization field screening, and a lightly doped N$^-$—AlGaN layer 35 (0.1-0.5 µm such as 0.3 µm, $n=2.5 \times 10^{17}$-$2 \times 10^{18}$ cm$^{-3}$) to reduce current crowding and prepare uniform current injection into the following $Al_bGa_{1-b}N/Al_wGa_{1-w}N$ MQW active-region 40. MQW 40 is made of alternatingly stacked n-$Al_bGa_{1-b}N$ barrier and $Al_wGa_{1-w}N$ well for a few times, for example, for 3-8 times. The barrier thickness is in the range of 8-16 nm, and the well thickness is 1.2-5.0 nm. The total thickness of MQW 40 is usually less than 200 nm, for example, being 75 nm, 100 nm, or 150 nm. The n-$Al_bGa_{1-b}N$ barrier and $Al_wGa_{1-w}N$ well may have an Al-composition in the range of 0.3-1.0, and 0.0-0.85, respectively, and the Al-composition difference of the barrier and well is at least 0.15, or so to ensure a barrier-well bandgap width difference ($\Delta E_g$) at least 400 meV to secure quantum confinement effect. Following MQW 40 is a p-type AlGaN structure 50. Structure 50 can be a p-AlGaN layer of uniform or varying Al-composition, or a p-AlGaN superlattice structure, or a p-AlGaN MQW structure, or a p-AlGaN multilayer structure serving as hole injecting and electron blocking layer. Structure 50 has enough Al-composition and modulation to allow for sufficient electron blocking and hole injection efficiencies. Further, structure 50 is also efficient in spreading hole current laterally. Formed on top of structure 50 is a hole supplier and p-contact layer 60, which can be engineered according to U.S. Pat. No. 10,276,746, the content of which is herewith incorporated by reference in its entirety, to have surface hole gas accumulation for p-type ohmic contact formation. Briefly, p-contact layer 60 is a thin (0.6-10 nm), strained, and heavily acceptor-doped nitride layer (e.g. Mg-doped, to a concentration about $10^{20}$ cm$^{-3}$ or more). For UVB/UVC LEDs (emissions from 200 nm-315 nm), p-contact layer 60 prefers to be a Mg-doped AlGaN layer with Al-composition larger than 0.7, or with Al-composition to be from 0.7 to 1.0. If MQW active-region 40 emits longer wavelength emissions, for example UVA emissions (315 nm-400 nm), or visible emissions, p-contact layer 60 can have less Al-composition.

The surface high-density 2DHG of p-contact layer 60 can form good ohmic contact to many metals, not only to high-work-function metals like Nickel (Ni), Tungsten (W), Molybdenum (Mo) Palladium (Pd), Platinum (Pt), Iridium (Ir), Osmium (Os), Rhodium (Rh) and Gold (Au), but also to some low-work-function metals like UV reflective metal Aluminum (Al) and visible light reflective Silver (Ag) and Indium (In). In this specification, high work-function means that the work function is larger than 5.0 eV, and low work-function means that the work function is less than 5.0 eV.

Figure 2:
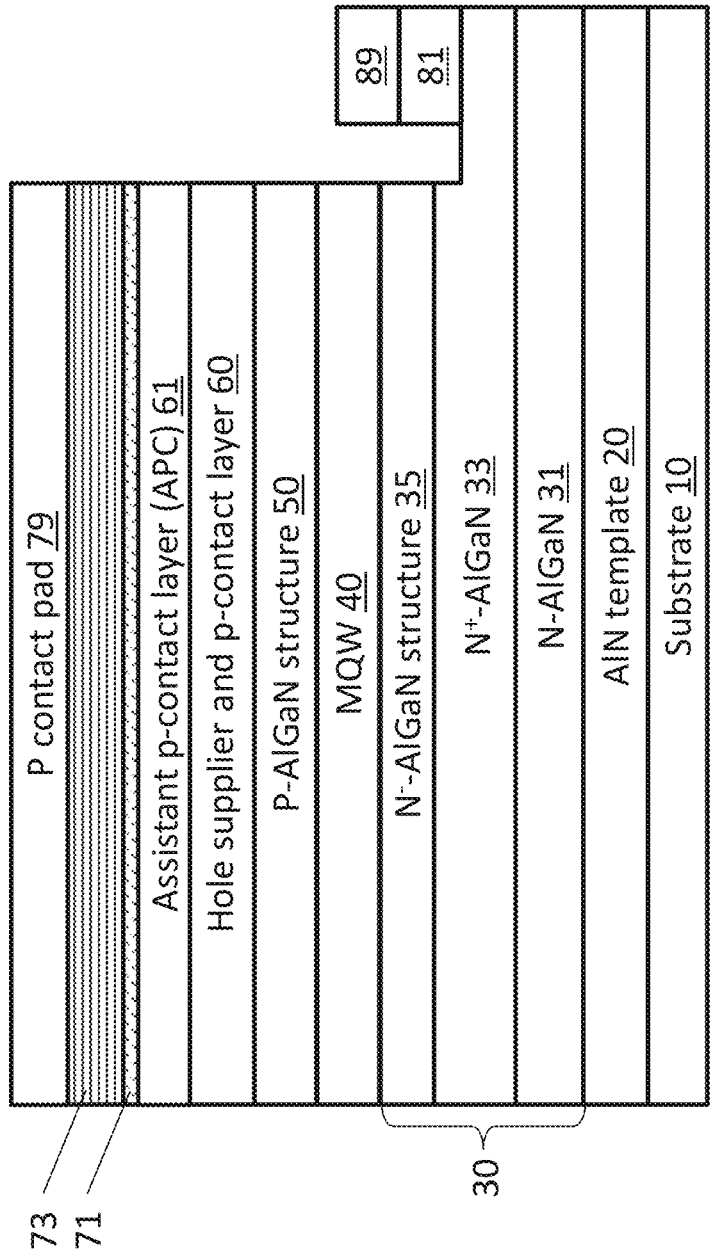
FIG. 2 illustrates a UV LED epitaxial layered structure according to another embodiment of the present invention.

Optionally, referring to FIG. 2, hole supplier and p-contact layer 60 can have an assistant p-contact layer (APC) 61 formed thereon. Assistant p-contact layer 61 is thin, 0.2-2 nm-thick, made of p-type AlGaN with small (for example, Al-composition smaller than 0.4) or even vanishing Al-composition, to provide protection to p-contact layer 60. Assistant p-contact layer 61 also holds 2DHG to the vicinity of surface.

Referring to FIGS. 1 and 2, a mesa is etched out to expose N—AlGaN structure 30, for deposition of n-ohmic contact 81, which can be made of thin metal layer stacks such as titanium/aluminum/titanium/gold (Ti/Al/Ti/Au) with respective layer thickness of 30-40/70-80/10-20/80-100 nm, for example 35/75/15/90 nm, or V/Al/V/Ag, V/Al/V/Au, and V/Al/Ti/Au, of respective thicknesses such as 20/60/20/100 nm. As seen from FIGS. 1 and 2, n-ohmic contact 81 is preferred to be formed on the heavily n-type doped NtAlGaN layer 33. Overlying n-ohmic contact 81 is n-contact pad 89 made of a thick (2-10 µm) gold or gold tin layer.

Referring to FIGS. 1 and 2, respectively formed on hole supplier and p-contact layer 60 and/or assistant p-contact layer 61 is a p-ohmic contact 71. According to an embodiment of the present invention, p-ohmic contact 71 is a metallic contact containing element oxygen (O). This means that p-ohmic contact 71 contains metal and oxygen elements, however, it does not need to be perfect stoichiometric metal oxides. According to an embodiment of the present invention, metallic oxygen-containing p-ohmic contact 71 formed over hole supplier and p-contact layer 60 and/or assistant p-contact layer 61 provides at least three merits. The first one is to improve contact stability. Metal atoms are susceptible to electric field-driven diffusion. Using metallic oxygen-containing p-ohmic contact can greatly reduce metal atoms field-driven diffusion, hence improve contact stability. The second one is that the formation of metallic oxygen-containing p-ohmic contact 71 according to an embodiment of the present invention enables O and Mg co-doping in p-type AlGaN structure 50. Proper O and Mg co-doping can reduce Mg acceptors' activation energy, presumably through the gettering effect of the deleterious hydrogen (H) atoms abundant in Mg-doped AlGaN layers. The third merit is that metallic oxygen-containing p-ohmic contact can reduce light absorption loss as compared to metal p-ohmic contact.

In the following content, for simplicity of description, p-ohmic contact 71 is said to be made of metal oxide, where the metal cations can be selected from nickel (Ni), indium (In), tin (Sn), copper (Cu), aluminum (Al), gallium (Ga), chromium (Cr), molybdenum (Mo), strontium (Sr), scandium (Sc), Yttrium (Y), zinc (Zn), rhodium (Rh), iridium (Ir), cobalt (Co), osmium (Os), palladium (Pd), platinum (Pt), and ruthenium (Ru).

P-ohmic contact 71 can be formed via thermal or chemical deposition one or more layers of metal oxide on p-contact layer 60 or assistant p-contact layer 61. The metal oxide can be a binary oxide, such as $NiO_x$ (NiO), $InO_x$ ($In_2O_3$), $SnO_x$ (SnO, $SnO_2$), $RhO_x$ ($Rh_2O_3$), $MoO_x$, and $IrO_x$, et al. These binary oxides do not have to be stoichiometric. According to embodiments of the present invention, the measurable oxygen level in the metal oxides can be from some doping level up to stoichiometric level, e.g., from $10^{19}$ $cm^{-3}$ up to stoichiometric level, or from $10^{20}$ $cm^{-3}$ up to stoichiometric level, or from $10^{21}$ $cm^{-3}$ up to stoichiometric level. The metal oxide can be a ternary oxide, such as $CuMO_x$ (such as x=2), where metal M can be selected from Al, Ga, In, Cr, Sr, Sc, and Y, or, be spinel type oxide, $ZnM_2O_x$ (such as x=4), where M=Rh, Ir, or Co. Optionally, the metal oxides possess p-type conductivity.

P-ohmic contact 71 may include one layer of metal oxide selected from the above discussed metal oxide. The thickness of the metal oxide layer can be in the range of 0.2-100 nm, such as 1 to 20 nm, or 2 to 10 nm.

P-ohmic contact 71 may include two layers of metal oxide, such as a layer of $NiO_x$ and a layer of $InO_y$, a layer of $InO_x$ and a layer of $RhO_y$, a layer of $NiO_x$ and a layer of $MoO_y$, a layer of $RhO_x$ and a layer of $MoO_y$, a layer of $NiO_x$ and a layer of $RhO_y$, et al. For example, p-ohmic contact 71 may include a first metal oxide layer and a second metal oxide layer formed on the first metal oxide layer selected from the following pairs:

a first layer $NiO_x$ and a second layer $MoO_y$, $InO_y$ or $RhO_z$; a first layer $MoO_x$ and a second layer $NiO_y$, $InO_y$ or $RhO_y$; and a first layer $InO_x$ and a second layer $NiO_y$, $MoO_y$, or $RhO_y$, et al. The thickness of the first metal oxide layer can be 0.1%-5% of the total thickness of the first and second metal oxide layers. Again, the measurable oxygen level in these metal oxides can be from some doping level up to stoichiometric level, e.g., from $10^{19}$ $cm^{-3}$ up to stoichiometric level.

P-ohmic contact 71 may include three layers of metal oxide such as, in the sequence of first, second and third metal oxide layer with the first layer facing p-contact layer 60 or assistant p-contact layer 61, a layer of $InO_x$, a layer of $NiO_y$ and a layer of $AuO_z$; a layer of $NiO_x$, a layer of $RhO_y$ and a layer of $MoO_z$; a layer of $NiO_x$, a layer of $MoO_y$ and a layer of $RhO_z$; et al. The thickness of the first metal oxide layer can be 0.1%-5% of the total thickness of the three metal oxide layers, and the ratio of the thickness of the second metal oxide layer to the thickness of the third metal oxide layer can be in the range of 1-10.

P-ohmic contact 71 can also be formed via oxidization of metal layer(s) formed on p-contact layer 60 or assistant p-contact layer 61, such as via oxygen plasma treatment of the respective metal layer(s), or thermal annealing of the respective metal layer(s) in oxygen-containing ambient. Oxygen-containing ambient as used in this disclosure means that the ambient or atmosphere contains oxygen, or water vapor, or oxygen/water vapor mixed with other suitable gases, such as nitrogen, oxygen, water vapor, argon, et al.

In some embodiments, a p-ohmic contact 71 is formed by sequentially depositing one or more layers of metal on the p-contact layer 60 or assistant p-contact layer 61 and oxidizing the one or more layers of metal such as via thermal annealing or oxygen plasma treatment. The metal can be selected from nickel (Ni), indium (In), tin (Sn), copper (Cu), aluminum (Al), gallium (Ga), chromium (Cr), molybdenum (Mo), strontium (Sr), scandium (Sc), Yttrium (Y), zinc (Zn), rhodium (Rh), iridium (Ir), cobalt (Co), osmium (Os), palladium (Pd), platinum (Pt), and ruthenium (Ru), a mixture of two, three, or four of these metals.

In some embodiments, p-ohmic contact 71 is formed by sequentially depositing two layers of metal on p-contact layer 60 or assistant p-contact layer 61 and oxidizing the two layers of metal, the two layers of metal include a first layer formed on p-contact layer 60 or assistant p-contact layer 61 and a second layer formed on the first layer and are selected from:

a Ni layer on p-contact layer 60 or assistant p-contact layer 61 and a Mo layer on the Ni layer, or an In layer on the Ni layer, or a Rh layer on the Ni layer; a Mo layer on p-contact layer 60 or assistant p-contact layer 61 and a Ni layer on the Mo layer, or an In layer on the Mo layer, or a Rh layer on the Mo layer; an In layer on p-contact layer 60 or assistant p-contact layer 61 and a Ni layer on the In layer, or a Mo layer on the In, or a Rh layer on the In layer; a Rh layer on p-contact layer 60 or assistant p-contact layer 61 and a Mo layer on the Rh layer, or a Ni layer on the Rh, or a Pd layer on the Rh layer. The thickness of the first layer can be in the range of 0.2-4 nm such as 0.5-2 nm, and the thickness of the second layer can be in the range of 2-100 nm, such as 2-20 nm or 5-10 nm.

In some embodiments, the p-ohmic contact 71 is formed by sequentially depositing three layers of metal on p-contact layer 60 or assistant p-contact layer 61 and oxidizing the three layers of metal, the three layers of metal include a first layer formed on p-contact layer 60 or assistant p-contact layer 61, a second layer formed on the first layer and a third layer formed on the second layer, and are selected from Ni, Rh, Mo, Pd, Ir, Os and Ru, respectively. The thickness of the first layer, the second layer and the third layer are in the range of 0.2-100 nm, 1-100 nm, and 1-100 nm, or optionally in the range of 0.2-2 nm, 1-20 nm, and 1-20 nm, respectively.

In some embodiments, during the process of annealing the one or more layers of metal in oxygen-containing ambient, oxygen also penetrates into p-contact layer 60 and p-type structure 50.

In embodiments where contact 71 is made via oxidizing a single metal, the single metal layer such as Ni, In, Sn, Mo, Rh, or Ir, et al can be deposited via e-beam vapor deposition with calibrated deposition rate. In embodiments where contact 71 is made via oxidizing two or more metals, respective metal can be deposited in sequence with respective layer thickness, or different metals can be deposited at the same time with different deposition rate to obtain targeted composition or mixture ratio of different metals.

When the metal oxide of p-ohmic contact 71 is formed by oxidizing corresponding metal layer(s) such as via thermal annealing or oxygen plasma treatment, the metal oxide layer(s) resulted from oxidizing the metal layer(s) may not have a clear boundary between layers due to inter-diffusion of metal atoms. For example, when p-ohmic contact 71 is formed by depositing two or more layers of metals and annealing the two or more metal layers in oxygen-containing ambient, during the annealing process, metals in the two or more layers will diffuse into each other across the boundary between layers and may even diffuse through the entire thickness of p-ohmic contact 71, while oxygen penetrates into the metal layers. In such cases, the boundary between initial metal layers becomes blurry, and the concentrations of each metal as well as oxygen may vary along the thickness of p-ohmic contact 71. In some embodiments, each of the metals and oxygen diffuses through the entire thickness of p-ohmic contact 71 and the concentrations of each metal as well as oxygen vary along the entire thickness of p-ohmic contact 71.

Figure 6:
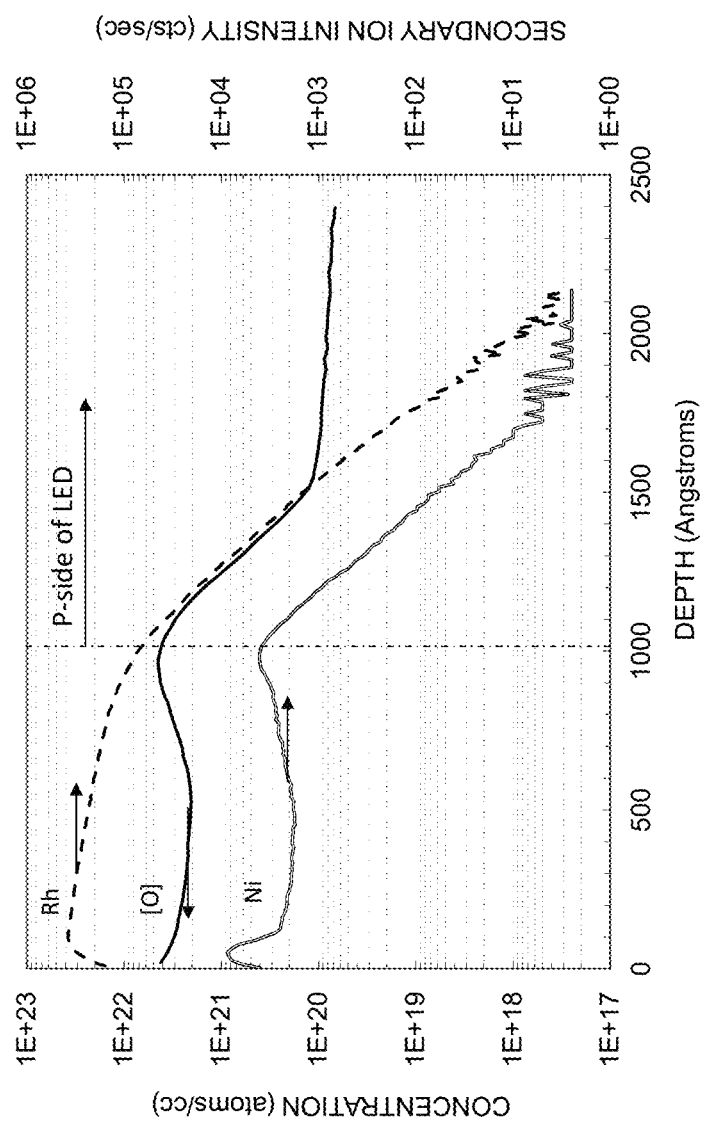
FIG. 6 plots SIMS elements depth profiles of the metal oxide p-ohmic contact of the LED used in FIGS. 3A and 3B.
Figure 7:
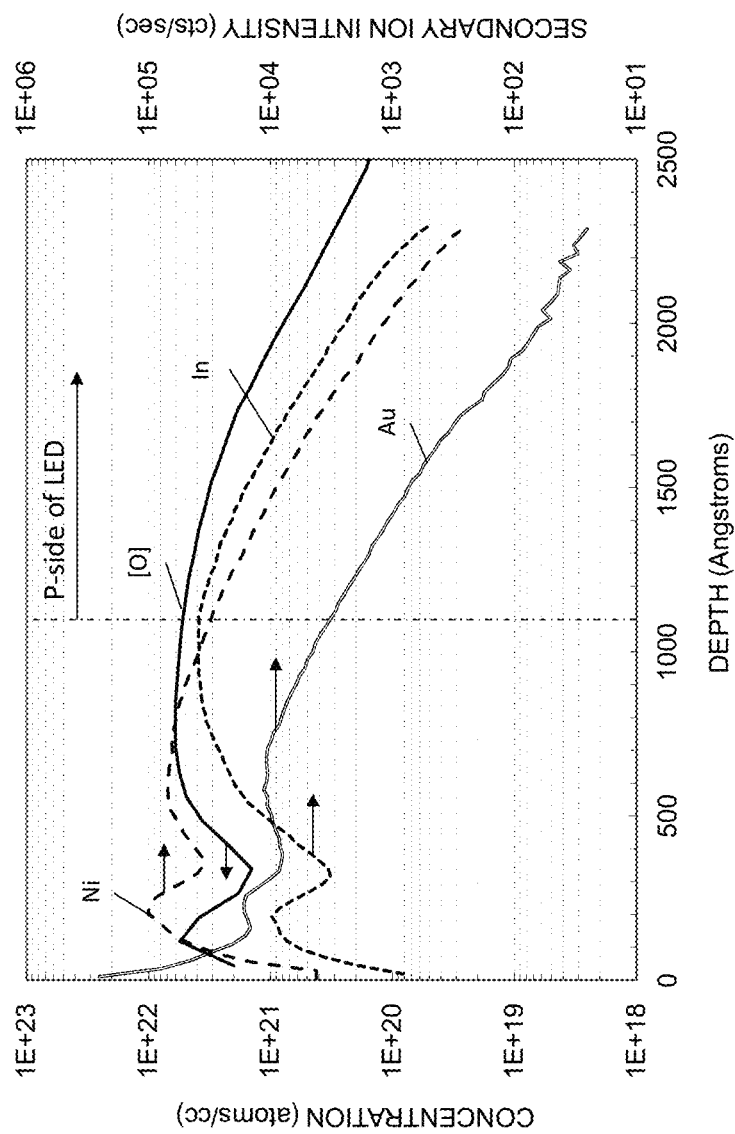
FIG. 7 plots SIMS elements depth profiles of the metal oxide p-ohmic contact of the LED used in FIGS. 4A and 4B.

In some embodiments, p-ohmic contact 71 includes two or more types of metals diffusing into each other's phase and diffusing through the entire thickness of p-ohmic contact 71, and oxygen penetrates into p-ohmic contact 71 through its entire thickness (See FIGS. 6 and 7 for example). The measurable oxygen level in p-ohmic contact 71 can be from some doping level up to stoichiometric level, e.g., from $10^{19}$ $cm^{-3}$ up to stoichiometric level, or from $10^{20}$ $cm^{-3}$ up to stoichiometric level, or from $10^{21}$ $cm^{-3}$ up to stoichiometric level. In the p-ohmic contact 71, the metals can be selected from nickel (Ni), indium (In), tin (Sn), copper (Cu), aluminum (Al), gallium (Ga), chromium (Cr), molybdenum (Mo), strontium (Sr), scandium (Sc), Yttrium (Y), zinc (Zn), rhodium (Rh), iridium (Ir), cobalt (Co), osmium (Os), palladium (Pd), platinum (Pt), and ruthenium (Ru).

In cases where p-ohmic contact 71 contains two types of metals, the two types of metals can be selected from the following pairs: first metal Ni and second metal Mo, In, or Rh; first metal Mo and second metal Ni, In, or Rh; first metal In and second metal Ni, Mo, or Rh. The molar fraction of the first metal is 0.1%-5% of the total moles of the first metal and the second metal.

In cases where p-ohmic contact contains three types of metals, the three types of metals include a first metal, a second metal and a third metal, and can be selected from Ni, Rh, Mo, Pd, Ir, Os and Ru. A molar fraction of the first metal, the second metal and the third metal are in the range of 0.1%-5%, 80%-90%, and 5%-19.9%, respectively. For example, the first metal can be Ni, and the second and third metals can be Rh and Mo, respectively, or, the first metal can be Ni, and the second and third metals can be Rh and Pd, respectively, et al.

In the above embodiments, oxygen may penetrate into p-contact layer 60 and p-type structure 50. The oxygen level in p-contact layer 60 and p-structure 50 can be in the range of $10^{20}$-$10^{21}$ $cm^{-3}$ and $10^{19}$-$4.0 \times 10^{20}$ $cm^{-3}$, respectively.

According to an embodiment of the present invention, the thermal annealing temperature or oxidation temperature depending on annealing ambient and metals deposited on p-contact layer 60 or assistant p-contact layer 61 is usually higher than 450° C., for example, in the range of 450-850° C., or 500-750° C. And the thermal annealing time or oxidation time depending on metal, metal film thickness, annealing temperature and ambient is usually more than 1 minute, for example, in the range of 1-20 minutes, or 2-10 minutes.

The oxidation process can be confirmed via analytic techniques such as Secondary Ion Mass Spectrometry (SIMS), Energy Dispersive X-Ray (EDX) and X-ray photoelectron spectroscopy (XPS). SIMS is a technique used to analyze elements of solid surfaces and thin films by sputtering the surface of the specimen with a focused primary ion beam and collecting and analyzing ejected secondary ions. SIMS has high detection sensitivity, can detect impurity levels as low as $10^{15}$ $cm^{-3}$, but is not suitable for composition determination. EDX analysis usually is combined in Transmission Electron Microcopy (TEM) or Scanning Electron Microscopy (SEM), where an electron beam is used to hit targeted atoms and knock off an electron from the atom inner shell, leaving a positively charged metastable atom. An outer shell electron will make quantum transition to fill the inner shell vacancy, releasing potential energy in the form of X-ray. The energy of this X-ray is unique to the specific element and transition so that EDX is widely applied to identify elements. EDX therefore can be used to check the oxidation process via looking into oxygen signature EDX peaks. EDX has relative low detection sensitivity but can be used to determine composition of alloys. It can be used to detect element with composition more than 1%. XPS on the other hand is based on photoelectric effect, using X-ray to knock off electrons from targeted atoms. The kinetic energy of the photoelectric electrons can be used to identify elements and their chemical states. For example, oxygen signature XPS peaks (O 1s) can be used to quantify metal oxidation process. Further, per oxidation, the inner shell peaks of metals (such as 3d peaks) can be shifted to higher energy as oxidation increases their binding energies. XPS is very sensitive to film surface chemical changes.

Formed on p-ohmic contact 71 is a metal reflector layer 73, which can be selected from metals Al, Pd, Pt, Os, Rh, Ir, In, Mo, and tungsten (W). Metal reflector layer 73 is preferably thicker than 10 nm, preferably 50 nm-thick, or 100 nm-thick. Optionally, metal reflector layer 73 is UV-reflective, for example, UVC-reflective, to maximize light extraction efficiency. In one embodiment, p-ohmic contact 71 is of a thickness 0.2-100 nm and metal reflector layer 73 is an Al layer of a thickness 90-110 nm, for example 100 nm. In another embodiment, p-ohmic contact 71 is of a thickness 0.2-2.0 nm and metal reflector layer 73 is a 75-nm Rd layer. In another embodiment, p-ohmic contact 71 is metal oxide of thickness 0.2-10.0 nm and metal reflector layer 73 is a Rd layer of a thickness 60-70 nm, for example 65 nm. In another embodiment, p-ohmic contact 71 is of a thickness 0.2-15.0 nm and metal reflector layer 73 is an Al layer of a thickness 70-80 nm, for example 75 nm. In still another embodiment, p-ohmic contact 71 is of a thickness 0.2-6.0 nm and metal reflector layer 73 is a Mo layer of a thickness 65-75 nm, for example 70 nm. In yet another embodiment, p-ohmic contact 71 is of a thickness 0.2-3.0 nm and metal reflector layer 73 is a Pd layer of a thickness 75-85 nm, for example 80 nm.

Formed on metal reflector layer 73 is a thick metal layer serving as p-contact pad 79, which can be made of a 2-8 μm gold layer or gold tin layer.

EXAMPLES

Three UVC LED wafers (#306, #394, #415) in the present disclosure were made using Metal Organic Chemical Vapor Deposition (MOCVD) according to the epitaxial structures shown in FIGS. 1 and 2. C-plane sapphire was used as substrate 10, with a 3.5 μm-thick AlN serving as AlN template 20. The N—AlGaN layer 31 is made of 2.5 μm-thick $Al_{0.58}Ga_{0.42}N$ doped with Si to a level of $4.5 \times 10^{18}$ $cm^{-3}$, and the NtAlGaN layer 33 and N$^-$—AlGaN layer 35 of the same composition to the N—AlGaN layer 31 are 450 nm and 200 nm thick and doped with Si to $8.5 \times 10^{18}$ $cm^{-3}$ and $3.5 \times 10^{17}$ $cm^{-3}$, respectively. The MQW 40 used was a five-pair multiple-quantum-well, with the barrier thickness and Al-composition to be 11.0 nm and 55%, and the well thickness and Al-composition to be 1.8 nm and 35%, respectively. Further the barriers were doped with Si at $3.0 \times 10^{18}$ $cm^{-3}$, and the wells were undoped. The p-AlGaN structure 50 used was an 8-pair AlGaN/AlGaN multiple-quantum-well structure, with barrier thickness and Al-composition to be 8.0 nm and 68%, respectively, and well thickness and Al-composition to be 1.6 nm and 55%, respectively. Hole supplier and p-contact layer 60 was formed directly on the last quantum well of p-AlGaN structure 50.

The three wafers, namely, wafers #306, #394, #415 were different in terms of hole supplier and p-contact layer. Wafer #306 had a hole supplier and p-contact layer 60 made of 1.2 nm Mg-doped AlN layer (refer to FIG. 1), whereas wafers #394 and #415 had p-contact layer 60 made of a Mg-doped 1.5 nm $Al_{0.82}Ga_{0.18}N$ with an additional assistant p-contact layer (APC) 61, which was a 0.8 nm-thick Mg-doped GaN layer (refer to FIG. 2).

The three wafers were fabricated into UVC LED chips using standard semiconductor lithography, etch, and metallization processes. Ti/Al/Ti/Au multi layers with respective layer thickness of 35/75/15/90 nm were used as n-ohmic contact (81). Wafers #306 and #415 were used to compare Rh/Ni and $RhO_x/NiO_y$ p-ohmic contacts (71), and wafer #394 was used to compare Au/Ni/In and $AuO_x/NiO_y/InO_z$ p-ohmic contacts (71). For this, a 0.5 nm Ni layer then a 98.5 nm Rh layer (Ni/Rh thickness ratio ~0.51%) were deposited on p-contact layer 60 of wafer #306 and on assistant p-contact layer 61 of wafer #415, and a 50 nm/50 nm/50 nm In/Ni/Au (In deposition first) metal stack was deposited on assistant p-contact layer 61 of wafer #394. After p-metal deposition, metal p-ohmic contacts and metal oxide p-ohmic contacts were formed via thermal annealing of the wafers under pure nitrogen ambient and under oxygen-containing ambient, respectively.

Figures 3A, 3B:
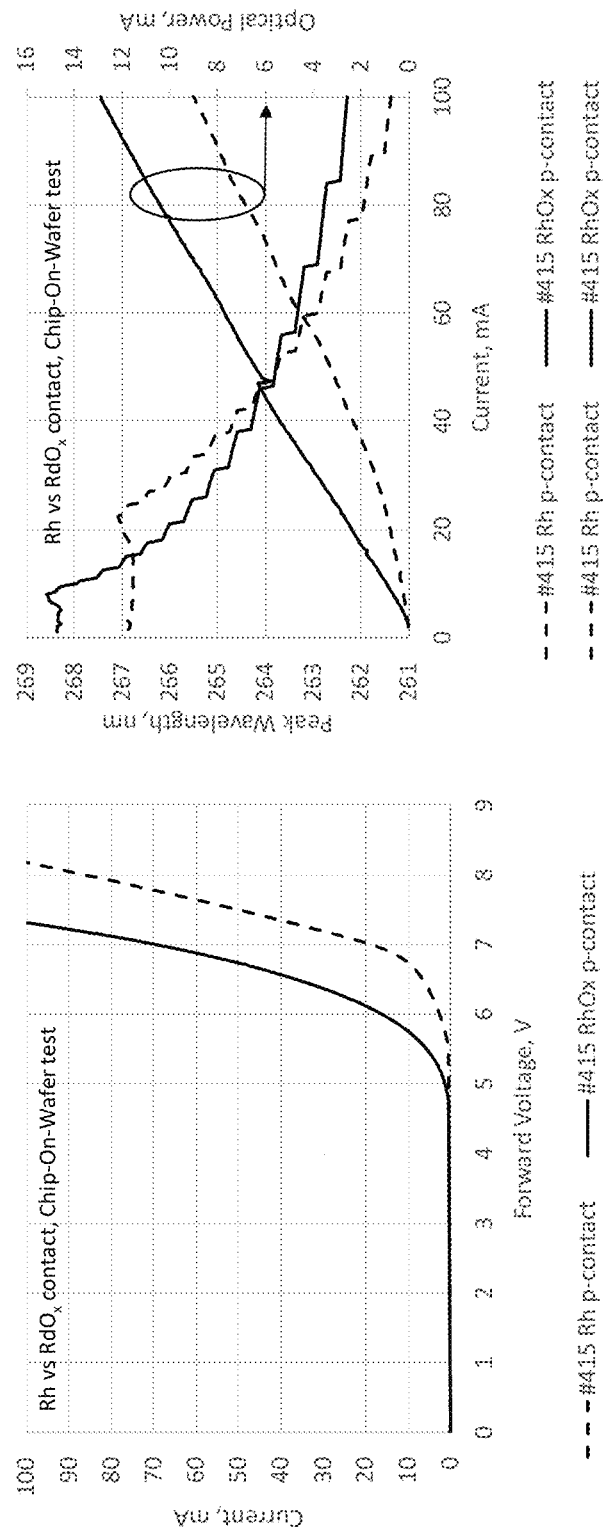
FIG. 3A plots current-voltage (IV) curves of two UVC LED chips with and without metal oxide p-ohmic contact according to an embodiment of the present invention.
FIG. 3B plots emission power and wavelength of two UVC LED chips with and without metal oxide p-ohmic contact according to an embodiment of the present invention.

Shown in FIG. 3A are current-voltage (IV) curves of representative UVC LED chips made from wafer #415 with metal (Rh/Ni) and metal oxide ($RhO_x/NiO_y$) p-ohmic contacts, respectively. Their respective emission power and wavelength were compared In FIG. 3B. As seen, the forward voltage was reduced and emission power was increased for the UVC LED chip with metal oxide p-ohmic contact. The emission peak wavelength was at 266 nm and blue shifted to 262 nm when current increased from 20 to 100 mA. The formation of metal oxide p-ohmic contact (71) via annealing of Rd/Ni films under oxygen-containing ambient was confirmed by SIMS measurements. The results are shown in FIG. 6, where depth profiles of elements O, Ni, and Rh are plotted for the metal oxide p-ohmic contact of the LED used in FIGS. 3A and 3B. As seen, upon thermal annealing, Ni diffused into Rh and mixed well with Rh, with two composition peaks, one in the proximity to the surface due to out diffusion and surface segregation, another at the initial deposition place which was interfaced with the LED p-type structure (assistant p-contact layer 61). Also evident is that the detected secondary ion intensity of Ni is relatively low because of the very thin metal thickness (nominal 0.5 nm). At least one of the functions of this very thin Ni layer is to enhance surface adhesion for the following thick Rh layer. The oxygen depth profile followed the Ni's trend, and even extended into the LED's p-type structure. This means that the formation of metal oxide p-ohmic contact 71 according to an embodiment of the present invention enables O and Mg co-doping in p-type AlGaN structure 50. Proper O and Mg co-doping can reduce Mg acceptors' activation energy and improve p-type doping efficiency, presumably through the gettering effect of the deleterious H atoms abundant in Mg-doped AlGaN layers. As such, seen from FIGS. 3A, 3B and 6, it is evident that $RhO_x/NiO_y$ p-ohmic contact is formed and outperforms Rh/Ni metal p-ohmic contact.

Figures 4A, 4B:
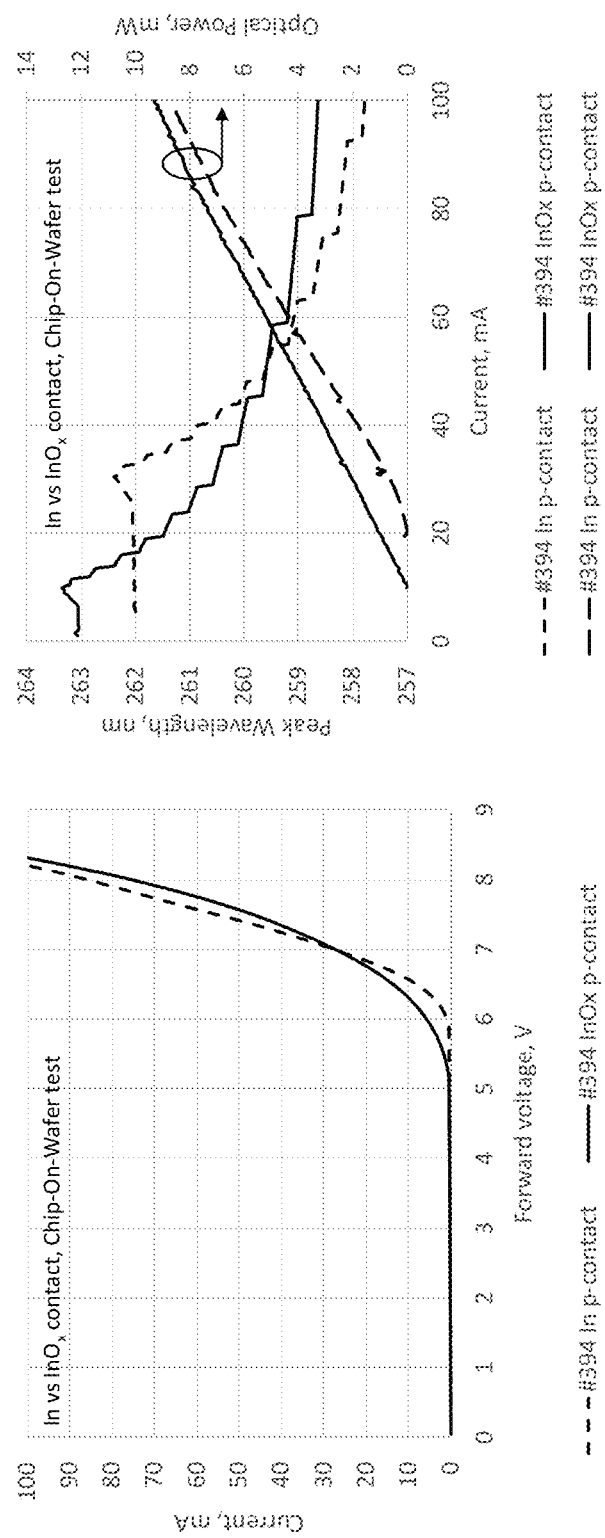
FIG. 4A plots current-voltage (IV) curves of two UVC LED chips with and without metal oxide p-ohmic contact according to an embodiment of the present invention.
FIG. 4B plots emission power and wavelength of UVC LED chips with and without metal oxide p-ohmic contact according to an embodiment of the present invention.

Shown in FIG. 4A are IV curves of representative UVC LED chips made from wafer #394 with Au/Ni/In and $AuO_x/NiO_y/InO_z$ p-ohmic contacts, respectively. Their respective emission power and wavelength were compared In FIG. 4B. As seen, the turn-on voltage was reduced and emission power was increased for the UVC LED chip with $AuO_x/NiO_y/InO_z$ p-ohmic contact. The emission peak wavelength was at 262 nm and blue shifted to 258 nm when current increased from 20 to 100 mA. The formation of metal oxide p-ohmic contact (71) via annealing of Au/Ni/In films under oxygen-containing ambient was confirmed by SIMS measurements. Shown in FIG. 7 are SIMS elements depth profiles of the metal oxide p-ohmic contact of the LED used in FIGS. 4A and 4B. As seen, upon thermal annealing, metal interdiffusion was significant, so the mixed metal oxide thickness measured by SIMS became about 100 nm instead of 150 nm as deposited. In and Ni both out diffused into Au and mixed well with Au, each forming two concentration peaks one around the surface and another at the initial film deposition place. The oxygen depth profile followed the Ni's and In's trend, and extended into the LED's p-type structure. As such, seen from FIGS. 4A, 4B and 7, it is evident that $AuO_x/NiO_y/InO_z$ p-ohmic contact is formed and outperforms Au/Ni/In metal p-ohmic contact.

Figures 5A, 5B:
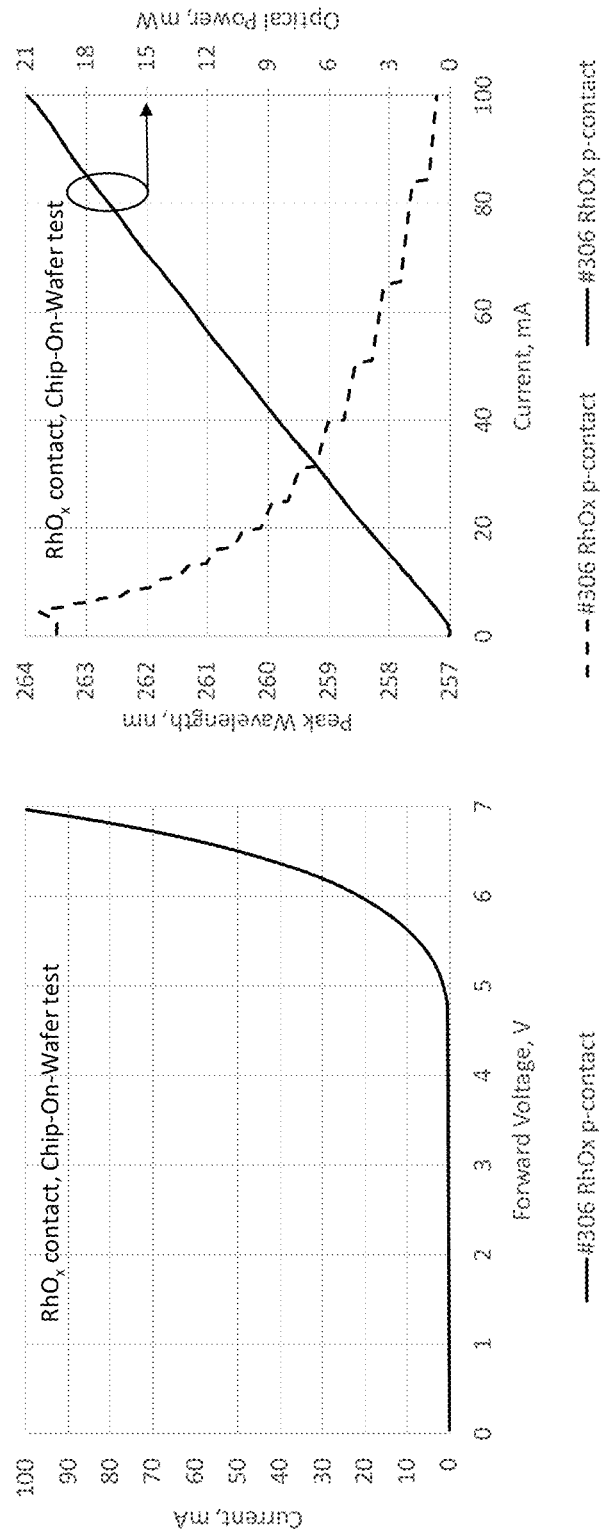
FIG. 5A plots current-voltage (IV) curve of a UVC LED chip according to an embodiment of the present invention.
FIG. 5B plots emission power and wavelength of a UVC LED chip according to an embodiment of the present invention.

Shown in FIG. 5A is IV curve of a representative UVC LED chip made from wafer #306 with $RhO_x/NiO_y$ p-ohmic contacts. Its emission power and wavelength were plotted In FIG. 5B. As seen, the forward voltage was 7.0V at 100 mA, with chip-on-wafer optical power 21 mW. The emission peak wavelength was at 260 nm and blue shifted to 257 nm when current increased from 20 to 100 mA. Comparing FIGS. 3A, 3B, 5A and 5B indicated that getting rid of assistant p-contact layer 61 increased emission power without voltage penalty.

Figure 8:
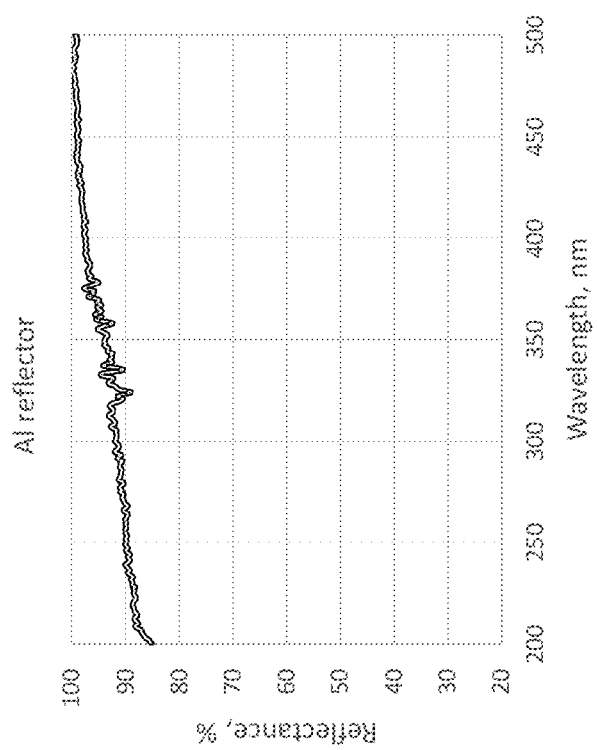
FIG. 8 plots reflectance curve of a 65-nm-thick Al reflector.
Figure 9:
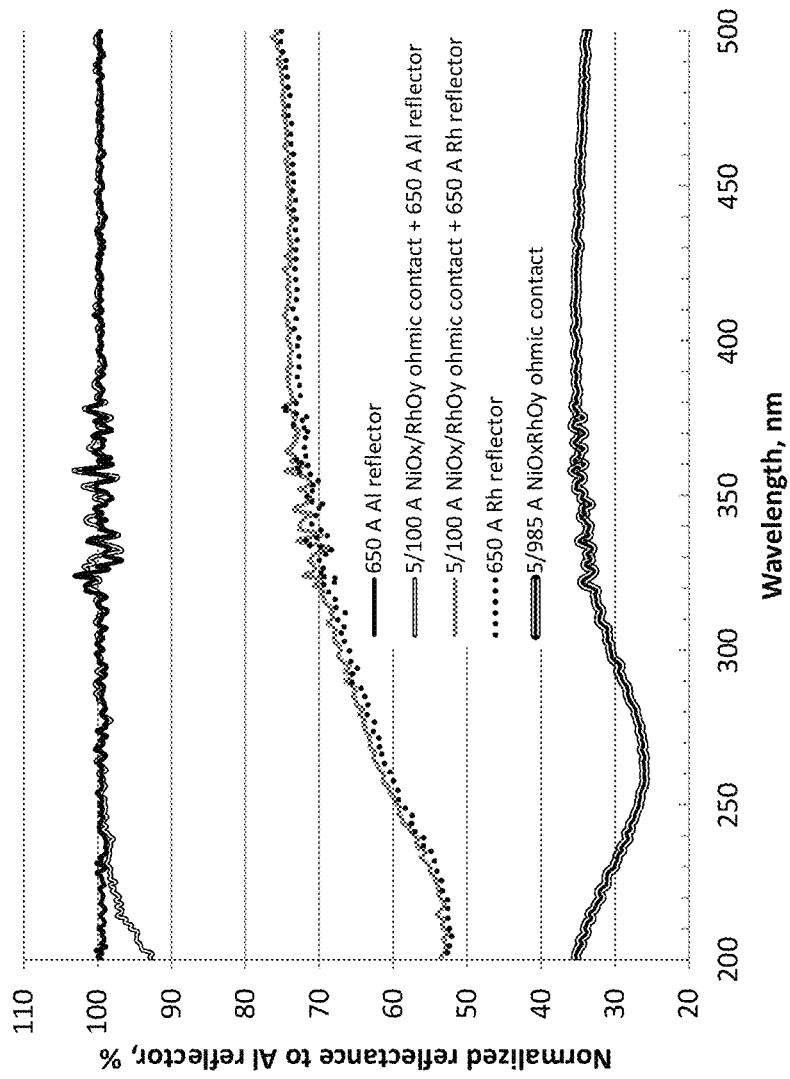
FIG. 9 plots the normalized reflectance curves (to the 65-nm-thick Al reflector reflectance curve shown in FIG. 8) of various reflectors according to one aspect of the present invention.

Metal oxide p-ohmic contact 71 according to an embodiment of the present invention may have certain UV absorption coefficient, therefore its thickness may affect the effective reflectance of the combined reflector of p-ohmic contact 71 and metal reflector layer 73. Shown in FIG. 8 is a measured reflectance curve of an Al reflector, made of a 65 nm-thick Al film deposited on a double side polished sapphire substrate. As seen, this Al reflector has reflectance 90% for light in the wavelength region of 240-300 nm. Shown in FIG. 9 are normalized reflectance (normalized to the Al-reflector reflectance as shown in FIG. 8) curves of various combined reflectors according to another aspect of the present invention. These combined reflectors include a 65-nm-thick Al reflector, a 65-nm-thick Rh reflector, a 0.5/98.5 nm-thick $NiO_x/RhO_y$ reflector, a 0.5/10 nm-thick $NiO_x/RhO_y$ plus 65 nm Rh combined reflector, and a 0.5/10 nm-thick $NiO_x/RhO_y$ plus 65 nm Al combined reflector. As seen, the 65-nm-thick Rh reflector has normalized reflectance 60-66%, i.e., reflectance 54-59.4% for light in the wavelength region of 250-300 nm. The 0.5/10 nm-thick $NiO_x/RhO_y$ plus 65 nm Rh combined reflector has very similar (yet negligibly higher) reflectance to the 65-nm-thick Rh reflector. Meanwhile, the 0.5/10 nm-thick $NiO_x/RhO_y$ plus 65 nm Al combined reflector has very similar reflectance to the 65-nm-thick Al reflector in the wavelengths above 240 nm, i.e., with ~90% reflectance. The 0.5/98.5 nm-thick $NiO_x/RhO_y$ reflector has normalized reflectance 28.4-30.6%, i.e., reflectance 25.6-27.5% for light in the wavelength region of 240-300 nm.

According to another aspect of the present invention, p-ohmic contact 71 together with metal reflector layer 73 forms a combined reflector. Therefore, the thickness of metal oxide p-ohmic contact 71 can be from 0.2 to 100 nm, such as from 1 to 20 nm, or from 2 to 10 nm.

The present disclosure has used UV LEDs as exemplary embodiments. It is noted that these metal oxides p-ohmic contact can also be used for other optical devices, such as laser diodes and photodetectors. The major difference of a photodetector and an LED lies in their active-regions. The active-region of an LED is commonly made of MQW for confining electrons and holes for enhanced radiative recombination rate, whereas the active-region of a photodetector is a light (photon) absorbing thick semiconductor layer, used to generate photon-induced electrons and holes, which are separated by a reversed bias to the PN junction to generate photocurrent for photon detection.

Figure 10:
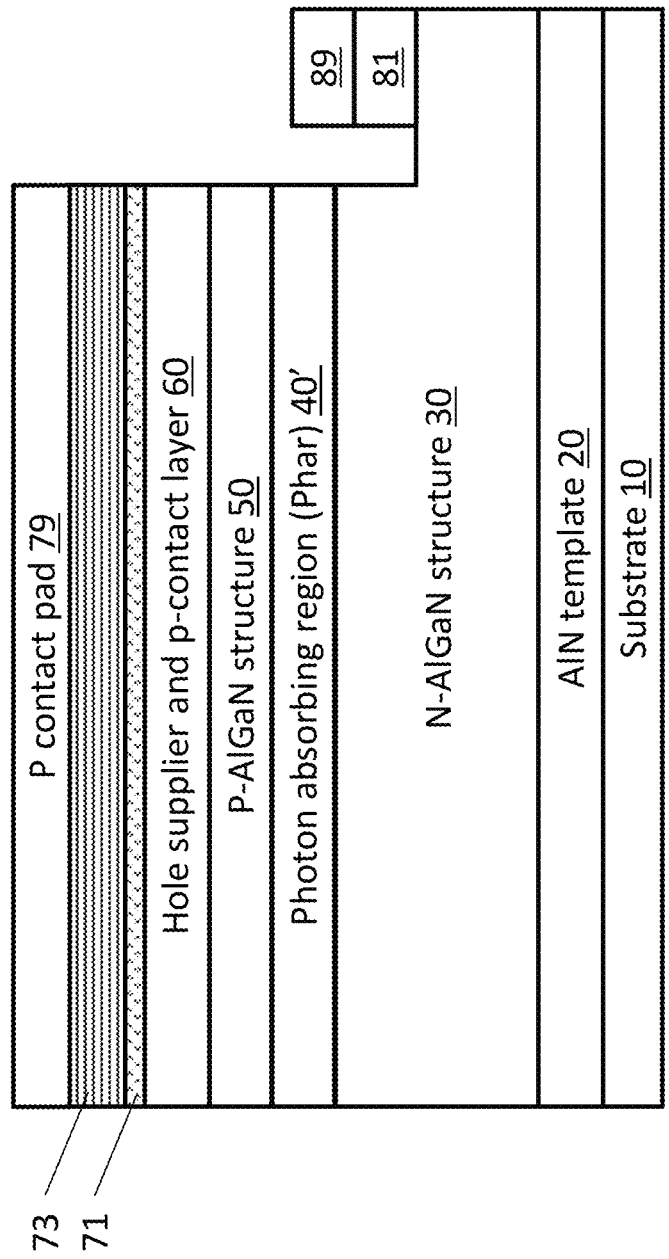
FIG. 10 illustrates a UV photodetector epitaxial layer structure according to an embodiment of the present invention.

Illustrated in FIG. 10 is a schematic layer structure of a photodetector using transparent hole supplier and p-contact layer 60 and metal oxide p-ohmic contact 71 according to an embodiment of the present invention. In the photodetector, substrate 10, template layer 20, n-AlGaN structure 30, p-AlGaN structure 50, transparent hole supplier, p-contact layer 60 and metal oxide p-ohmic contact 71, metal reflector layer 73, p-contact pad 79, n-ohmic contact 81, and n-contact pad 89 can be the same as or different than those discussed above in connection with the LED structure.

As seen, the photodetector can be formed over a high-quality template or window layer 20, which in turn can be formed on a substrate 10. For solar blind applications, substrate 10 can be a sapphire or AlN wafer, and template layer 20 can be an AlN layer or AlGaN layer with Al-composition higher enough to assuring UV light transparency to the Photon Absorbing Region (Phar) 40' (photodetector's active-region), which can be made of intrinsic AlGaN with a thickness of 100-500 nm, such as 200-300 nm. The thickness of photon absorbing region 40' is arranged so that enough photons are absorbed and photocurrent is generated. In practice, the Al-composition of window layer 20 can be at least 20%, or 30%, or 50% more than that of the photon absorbing region 40'. For example, the Al-composition of window layer 20 can be in the range of 0.6-1.0, while the Al-composition of photon absorbing region 40' is 0.46 for 280 nm and shorter wavelength detection. N—AlGaN structure 30 can be a Si-doped AlGaN layer transparent to the targeted detection wavelength with an Al-composition in the range of 0.5-0.7. For solar blind detection of 280 nm and shorter wavelengths, the targeted Al-composition of the intrinsic AlGaN material for photon absorbing region 40' is not less than 0.46 (here calculated by assuming GaN and AlN bandgap energy to be respectively 3.42 and 6.2 eV, and bowing parameter for AlGaN bandgap energy to be −1), for example, 0.46 to 1.0, or 0.47 to 0.55. Formed on photon absorbing region 40' is a p-AlGaN structure 50, which can be a p-type AlGaN layer with Al-composition larger than or equal to that of N—AlGaN structure 30. N—AlGaN structure 30 and p-AlGaN structure 50 can also be the same or similar to their counterparts found in a UV LED structure such as shown in FIGS. 1 and 2. Formed on p-AlGaN structure 50 is a hole supplier and p-contact layer 60, which is followed by a metal oxide p-ohmic contact 71 and a UV reflective p-metal layer 73, capped with a thick metal p-contact pad 79.

The present disclosure has been described using exemplary embodiments. However, it is to be understood that the scope of the present invention is not limited to the disclosed embodiments. On the contrary, it is intended to cover various modifications and similar arrangement or equivalents which can be obtained by a person skilled in the art without creative work or undue experimentation. The scope of the claims, therefore, should be accorded the broadest interpretation so as to encompass all such modifications and similar arrangements and equivalents.

What is claimed is:

1. A photodetector comprising:
    an n-type structure, an UV transparent p-type structure, and a photon absorbing region sandwiched between the n-type structure and the UV transparent p-type structure;
    an UV transparent p-contact layer formed on the UV transparent p-type structure, wherein the UV transparent p-contact layer is a strained Mg-doped AlGaN layer with Al-composition in the range of 0.7-1; and
    a p-ohmic contact of a thickness in the range of 0.2-100 nm formed on the p-contact layer, wherein the p-ohmic contact comprises one or more layer of metal oxide, wherein the metal oxide is a binary oxide selected from $NiO_x$, $InO_x$, $SnO_x$ and $RhO_x$, or a ternary oxide of formula $CuMO_x$, where metal M is selected from Al, Ga, In, Cr, Sr, Sc, and Y; or is a spinel type oxide of formula $ZnM_2O_x$, where metal M is selected from Rh, Ir, or Co; and when the p-ohmic contact comprises more than one layer of metal oxide, each layer of metal oxide is independently selected from the binary oxide, the ternary oxide, and the spinel type oxide.

2. The photodetector of claim 1, wherein the p-ohmic contact comprises one layer of the metal oxide.

3. The photodetector of claim 1, wherein the p-ohmic contact comprises two layers of metal oxide, selected from a $NiO_x$ layer facing the UV transparent p-contact layer and a $MoO_y$ layer on the $NiO_x$ layer, a $NiO_x$ layer facing the UV transparent p-contact layer and a $InO_y$ layer on the $NiO_x$ layer, a $NiO_x$ layer facing the UV transparent p-contact layer and a $RhO_z$ layer on the $NiO_x$ layer, a $RhO_x$ layer facing the UV transparent p-contact layer and a $MoO_y$ layer on the $RhO_x$ layer, a $MoO_x$ layer facing the UV transparent p-contact layer and a $RhO_y$ layer on the $MoO_x$ layer, a $InO_x$ layer facing the UV transparent p-contact layer and a $NiO_y$ layer on the $InO_x$ layer, a $InO_x$ layer facing the UV transparent p-contact layer and a $MoO_y$ layer on the $InO_y$ layer, or a $InO_x$ layer facing the UV transparent p-contact layer and a $RhO_y$ layer on the $InO_x$ layer, wherein a thickness of the metal oxide layer facing the UV transparent p-contact layer in the two layers of metal oxide is 0.1%-5% of a total thickness of the two layers of metal oxide.

4. The photodetector of claim 1, wherein the p-ohmic contact is of a thickness in the range of 1-10 nm.

5. The photodetector of claim 1, further comprising an assistant p-contact layer formed on the UV transparent p-contact layer, wherein the assistant p-contact layer is made of p-type AlGaN with an Al-composition in the range of 0-40% and a thickness in the range of 0.2-2 nm.

6. The photodetector of claim 1, further comprising a metal reflector layer formed on the p-ohmic contact.

7. The photodetector of claim 6, wherein the metal reflector layer is made from a metal selected from Al, Pd, Pt, Os, Rh, Ir, In, Mo, and W and has a thickness in the range of 10-200 nm.

8. A photodetector comprising:
    an n-type structure, an UV transparent p-type structure, and a photon absorbing region sandwiched between the n-type structure and the UV transparent p-type structure;
    an UV transparent p-contact layer formed on the UV transparent p-type structure, wherein the UV transparent p-contact layer is a strained Mg-doped AlGaN layer with Al-composition in the range of 0.7-1; and
    a p-ohmic contact of a thickness in the range of 0.2-100 nm formed on the UV transparent p-contact layer, wherein the p-ohmic contact is formed by sequentially depositing one or more layers of metal on the UV transparent p-contact layer and oxidizing the one or more layers of metal to form metal oxide, wherein the metal oxide is a binary oxide selected from $NiO_x$, $InO_x$, $SnO_x$ and $RhO_x$, or a ternary oxide of formula $CuMO_x$, where metal M is selected from Al, Ga, In, Cr, Sr, Sc, and Y; or is a spinel type oxide of formula $ZnM_2O_x$, where metal M is selected from Rh or Co.

9. The photodetector of claim 8, wherein oxidizing the one or more layers of metal is conducted by annealing the one or more layers of metal in oxygen-containing ambient at a temperature in the range of 450-850° C. for a period of 1-20 minutes.

10. The photodetector of claim 9, wherein the p-ohmic contact is formed by sequentially depositing two layers of metal on the p-contact layer and oxidizing the two layers of metal, the two layers of metal include a first layer formed on the p-contact layer and a second layer formed on the first layer and are selected from:
   a Ni layer on the p-contact layer and a Mo layer on the Ni layer, or an In layer on the Ni layer, or a Rh layer on the Ni layer;
   a Mo layer on the p-contact layer and a Ni layer on the Mo layer, or an In layer on the Mo layer, or a Rh layer on the Mo layer;
   an In layer on the p-contact layer and a Ni layer on the In layer, or a Mo layer on the In, or a Rh layer on the In layer;
   a Rh layer on the p-contact layer and a Mo layer on the Rh layer, or a Ni layer on the Rh, or a Pd layer on the Rh layer;
   wherein a thickness of the first layer is in the range of 0.2-2 nm, and a thickness of the second layer is in the range of 2-100 nm, optionally 5-20 nm.

11. The photodetector of claim 9, wherein the p-ohmic contact is formed by sequentially depositing three layers of metal on the p-contact layer and oxidizing the three layers of metal, the three layers of metal include a first layer formed on the p-contact layer, a second layer formed on the first layer and a third layer formed on the second layer, and are selected from Ni, Rh, Mo, Pd, Ir, Os and Ru, respectively;
   wherein a thickness of the first layer, the second layer and the third layer are in the range of 0.2-2 nm, 1-20 nm, and 1-20 nm, respectively.

12. The photodetector of claim 8, wherein, during oxidizing the one or more layers of metal, oxygen penetrates into the UV transparent p-contact layer and the UV transparent p-type structure.

13. The photodetector of claim 8, wherein the p-ohmic contact is of a thickness in the range of 1-10 nm.

14. The photodetector of claim 8, further comprising a metal reflector layer formed on the p-ohmic contact.

15. The photodetector of claim 8, further comprising a template layer, wherein the n-type structure is formed on the template layer, and both the template layer and the n-type structure are UV transparent.

16. The photodetector of claim 15, wherein an Al-composition of the template layer is 20-50% higher than an Al-composition of the photon absorbing region.

17. The photodetector of claim 8, wherein the photon absorbing region is made of intrinsic AlGaN with a thickness of 100-500 nm.

* * * * *